(12) United States Patent
Mory et al.

(10) Patent No.: US 7,373,591 B2
(45) Date of Patent: May 13, 2008

(54) BINARY FORMAT FOR MPEG-7 INSTANCES

(75) Inventors: Benoit Mory, Paris (FR); Nicolas Santini, Paris (FR); Franck Laffargue, Poissy (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 540 days.

(21) Appl. No.: 09/982,269

(22) Filed: Oct. 17, 2001

(65) Prior Publication Data

US 2002/0138517 A1 Sep. 26, 2002

(30) Foreign Application Priority Data

Oct. 17, 2001 (EP) .................................. 00402876

(51) Int. Cl.
*G06F 15/00* (2006.01)
*G06F 17/00* (2006.01)
(52) U.S. Cl. ............................... 715/501.1; 715/500.1; 715/513; 715/523
(58) Field of Classification Search ............. 715/501.1, 715/513, 500.1, 523
See application file for complete search history.

(56) References Cited

U.S. PATENT DOCUMENTS

| | | | | |
|---|---|---|---|---|
| 6,236,395 | B1 * | 5/2001 | Sezan et al. ................. | 345/723 |
| 6,360,234 | B2 * | 3/2002 | Jain et al. ................. | 715/500.1 |
| 6,549,922 | B1 * | 4/2003 | Srivastava et al. ........... | 707/205 |
| 6,564,263 | B1 * | 5/2003 | Bergman et al. ............ | 709/231 |
| 6,593,936 | B1 * | 7/2003 | Huang et al. ................ | 345/619 |
| 6,646,676 | B1 * | 11/2003 | DaGraca et al. ............ | 348/155 |
| 6,665,731 | B1 * | 12/2003 | Kumar et al. ............... | 709/246 |
| 6,748,382 | B1 * | 6/2004 | Mohan et al. ................ | 707/10 |
| 6,772,180 | B1 * | 8/2004 | Li et al. ..................... | 715/513 |
| 6,877,134 | B1 * | 4/2005 | Fuller et al. ............. | 715/500.1 |
| 6,883,137 | B1 * | 4/2005 | Girardot et al. ............ | 715/513 |
| 6,963,972 | B1 * | 11/2005 | Chang et al. ................ | 713/153 |
| 6,966,027 | B1 * | 11/2005 | Krasinski ..................... | 715/513 |
| 7,028,312 | B1 * | 4/2006 | Merrick et al. ............. | 719/330 |
| 7,089,543 | B2 * | 8/2006 | Rising, III ................... | 717/144 |
| 7,203,692 | B2 * | 4/2007 | Tabatabai et al. ........... | 707/102 |
| 7,231,394 | B2 * | 6/2007 | Walker et al. .............. | 707/101 |
| 7,240,285 | B2 * | 7/2007 | Rising et al. ................ | 715/523 |
| 2001/0018693 | A1 * | 8/2001 | Jain et al. .................... | 707/500 |
| 2002/0120652 | A1 * | 8/2002 | Rising et al. ................ | 707/513 |
| 2002/0126666 | A1 * | 9/2002 | Rising et al. ................ | 370/389 |
| 2002/0138514 | A1 * | 9/2002 | Rising et al. ................ | 707/512 |
| 2002/0159519 | A1 * | 10/2002 | Tabatabai et al. ....... | 375/240.01 |

(Continued)

FOREIGN PATENT DOCUMENTS

WO   WO9734240   3/1997

(Continued)

OTHER PUBLICATIONS

Salembier, Philippe, et al., MPEG-7: Multimedia content Description Interface, Introduction to MPEG-21 workshop, Mar. 20-21, 2000, pp. 1-21.*

(Continued)

*Primary Examiner*—John Breene
*Assistant Examiner*—Robert Stevens

(57) ABSTRACT

An encoding and a decoding method for transmitting and storing description element(s) of an XML-like document which is an instance of an XML-like schema.

9 Claims, 3 Drawing Sheets

U.S. PATENT DOCUMENTS

Figure 1:
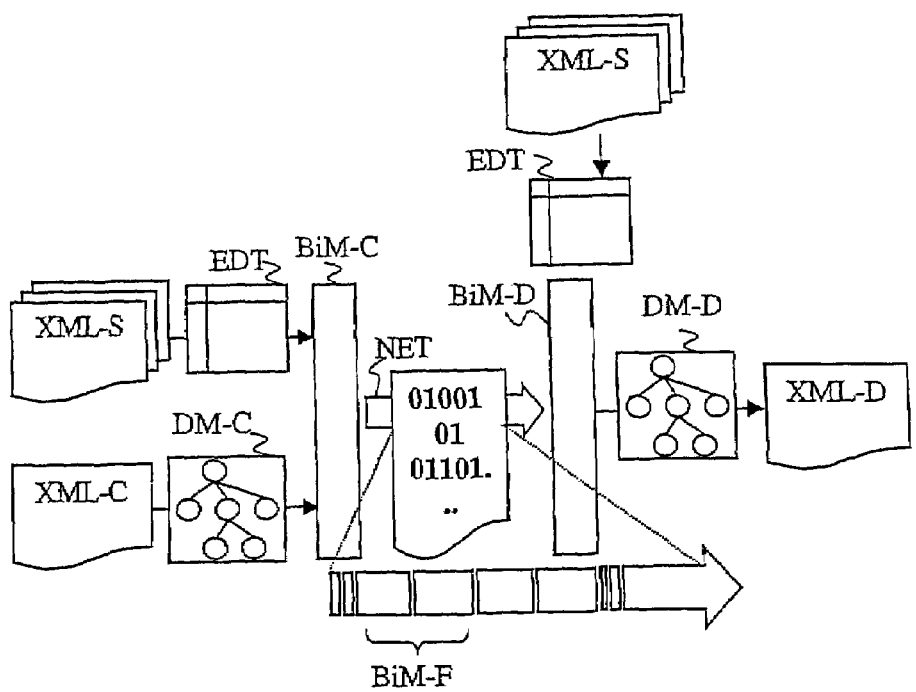

| | | | |
|---|---|---|---|
| 2002/0170070 A1* | 11/2002 | Rising et al. | 725/119 |
| 2002/0184336 A1* | 12/2002 | Rising, III | 709/217 |
| 2002/0198905 A1* | 12/2002 | Tabatabai et al. | 707/501.1 |
| 2003/0028557 A1* | 2/2003 | Walker et al. | 707/500 |
| 2003/0031260 A1* | 2/2003 | Tabatabai et al. | 375/240.25 |
| 2003/0037301 A1* | 2/2003 | Rising, III | 715/513 |
| 2005/0193425 A1* | 9/2005 | Sull et al. | 725/135 |
| 2007/0234192 A1* | 10/2007 | Rising et al. | 715/500 |

FOREIGN PATENT DOCUMENTS

| | | | |
|---|---|---|---|
| WO | WO 00/28725 | * | 5/2000 |

OTHER PUBLICATIONS

Chiariglione, Leonardo (convenor), "Resolutions of 49th WG 11 Meeting", ISO/IEC JTC 1/SC 29/WG 11 Coding of Moving Pictures and Audio, Doc. No. N2903, downloaded from: www.itscj.ipsj.or.jp/sc29/open/29view/29n32651.pdf, dated: Oct. 1999, pp. 1-15.*

Martinez, José M. (editor), "Introduction to MPEG-7 (version 1.0)", ISO/IEC JTC 1/SC 29/WG 11 Coding of Moving Pictures and Audio, Doc. No. N3545, Jul. 2000, pp. 1-10 (plus cover).*

"MPEG-7: Context and Objectives (version—10 Atlantic City)", ISO/IEC JTC1/SC29/WG 11 Coding of Moving Pictures and Audio, Doc. No. N2460, downloaded from: www.tnt.uni-hannover.de/project/ mpeg/audio/public/mpeg7/w2460.pdf, dated: Oct. 1998, pp. 1-11.*

Hunter, Jane, "MPEG-7 Behind the Scenes", D-Lib Magazine, vol. 5, No. 9, ISSN: 1082-9873, downloaded from: www.dlib.org/dlib/september99/hunter/09hunter.html, dated: Sep. 1999, pp. 1-12.*

Vass, Jozsef, "MPEG-7: Multimedia Content Description Interface", downloaded from: meru.cecs.missouri.edu/mm_seminar/mpeg7.html, dated: Feb. 2, 1998, pp. 1-5.*

Mulder, P., "The Integration of Metadata from Production to Consumer", EBU Technical Review, Sep. 2000, pp. 1-5.*

Auffret, Gwendal, et al., "Audiovisual-based Hypermedia Authoring: Using Structured Representations for Efficient Acess to AV Documents", Hypertext '99, ACM 1999 1-58113-064-3/99/2, Feb. 1999, pp. 169-178 (plus citation sheet).*

Hu, Michael J., et al., "Multimedia Description Framework (MDF)for Content Description of Audio/Video Documents", DL'99, ACM 1999 1-58113-145-3/99/08, Aug. 1999, pp. 67-75 (plus citation sheet).*

Hu, Michael J., et al., "Multimedia Description Framework (MDF)for Content Description of Audio/Video Documents", downloaded from: arxiv.org/pdf/cs.DL/9902016.pdf, dated: Jun. 2, 1999, pp. 1-20.*

Staab, Steffan, "Intelligent Systems on the World Wide Web: 11 MPEG-7 Lecture Slides", downloaded from: "www.aifb.uni-karlsruhe.de/WBS/sst/Teaching/Intelligente System im WWW SS 2000/11-MPEG.pdf", dated: Aug. 23, 2000, slides 1-15 (plus 2 date pages).*

North, Simon, et al., SAMS Teach yourself XML in 21 Days, Sam's Publishing, Indianapolis, IN, © 1999, pp. 291-305, 343-359 and 361-373.*

Microsoft Computer Dictionary, 5th Edition, Microsoft Press, Redmond WA, © 2002, pp. 252, 510 and 532.*

North, Simon, et al., Sam's Teach Yourself XML in 21 Days, Sam's Publishing, Indianapolis, IN, Mar. 1999, p. 105.*

Liefke, Hartmut, et al., "An Extensible Compressor for XML Data", SIGMOD Record, vol. 29, No. 1, Mar. 2000, pp. 57-62.*

Martin, Bruce, et al., editors, "WAP Binary XML Content Format", W3C NOTE 24, Jun. 1999, pp. 1-22, (downloaded from: www.w3.org/TR/wbxml/).*

Avaro, Olivier, et al., "MPEG-4 Systems: Overview", Signal Processing: Image Communication, vol. 15, Issues 4-5, Jan. 2000, pp. 281-298.*

Everything You Wanted to Know About MPEG=7: Part 2, Frank Nack, GMD-IPSI, Adam T. Lindsay, (Starlab) 1999, IEEE, pp. 64-73.

* cited by examiner

BINARY FORMAT FOR MPEG-7 INSTANCES

The present invention concerns an encoding method for encoding a description element of an instance of an XML-like schema defining a hierarchical structure of description elements, said hierarchical structure comprising hierarchical levels, parent description elements and child description elements, said description element to be encoded comprising a content.

It also concerns a decoding method for decoding a fragment comprising a content and a sequence of identification information.

It also concerns a encoder intended for implementing said encoding method, a decoder intended for implementing said decoding method, and a transmission system comprising such a encoder and/or such a decoder.

It further concerns a table intended to be used in such an encoding or decoding method and a signal transporting encoded description elements generated by using such an encoding method.

The invention is applicable to XML-like instances of XML-like schema. In particular it is applicable to MPEG-7 documents.

XML is a recommendation of the W3C consortium (extensible Markup Language 1.0 dated Oct. 6, 2000). XML-schema is also a recommendation of the W3C consortium. An XML-schema defines a hierarchical structure of description elements (called element or attribute in the W3C recommendation). An instance of an XML-schema comprises description elements structured as defined in said XML-schema.

An object of the invention is to propose an encoding and a decoding method for transmitting and storing one or more description element(s) of an XML-like document which is an instance of an XML-like schema.

According to the invention an encoding method as described in the introductory paragraph is characterized in that it consists in:
  using at least one table derived from said schema, said table containing identification information for solely identifying each description element in a hierarchical level, and structural information for retrieving any child description element from its parent description element,
  scanning a hierarchical memory representation of said instance from parent description elements to child description elements until reaching the description element to be encoded, and retrieving the identification information of each scanned description element,
  encoding said description element to be encoded as a fragment comprising said content and a sequence of the retrieved identification information.

When a description element is defined in the schema as possibly having multiple occurrences, said table further comprises for said description element an occurrence information for indicating that said description element may have multiple occurrences in an instance, and when an occurrence having a given rank is scanned during the encoding, the corresponding retrieved identification information is indexed with said rank.

And a decoding method according to the invention as described in the introductory paragraph is characterized in that it consists in:
  using at least one table derived from an XML-like schema, said schema defining a hierarchical structure of description elements comprising hierarchical levels, parent description elements and child description elements, said table containing identification information for solely identifying each description element in a hierarchical level, and structural information for retrieving any child description element from its parent description element,
  scanning said sequence identification information by identification information,
  at each step searching in said table for the description element associated to the current identification information and adding said description element to a hierarchical memory representation of an instance of said schema if not already contained in said hierarchical memory representation,
  adding said content to the description element of said hierarchical memory representation that is associated to the last identification information of said sequence.

When a description element is defined in the schema as possibly having multiple occurrences, said table further comprises for said description element an occurrence information for indicating that said description element may have multiple occurrences in an instance, and when said sequence comprises an indexed identification information, said index is interpreted as an occurrence rank for the associated description element, same description element(s) of lower rank(s) being added to said hierarchical memory representation if not already contained in it.

According to the invention each description element is represented by an independent fragment in the stream ensuring random-access to elements and attributes as well as a high level of flexibility as far as the incremental transfer is concerned. This fragment approach also takes into account the fundamental flexible and extensible nature of MPEG-7 by using schemas to compute the sequence of identification information associated to a given description element. The fragment approach allows the proposed binary format to fulfill the following properties:
  Random access to instance elements and attributes
  Incremental non-ordered and scalable transfer.
  Compactness: only elements and attributes that have a primitive type content are coded.
  Easy integration with instance update protocol.
  Easy parsing and partial instantiation of binary MPEG7 descriptions.

The other advantages of the invention are captured by the use of an intermediate representation of the schema. Indeed, the table which is directly and unambiguously generated from the schema, allows to share a common knowledge about the possible valid instances between a server and a client, in a form dedicated to the binary encoding and decoding of these instances. This common knowledge, gathering information such as structure, type, and tag name of the elements and attributes, does not need to be sent to the client, which leads to an efficient schema-aware encoding of the instances. This allows also the binary format to achieve a full extensibility support for future schemas defined inside or outside MPEG-7.

Figure 2:
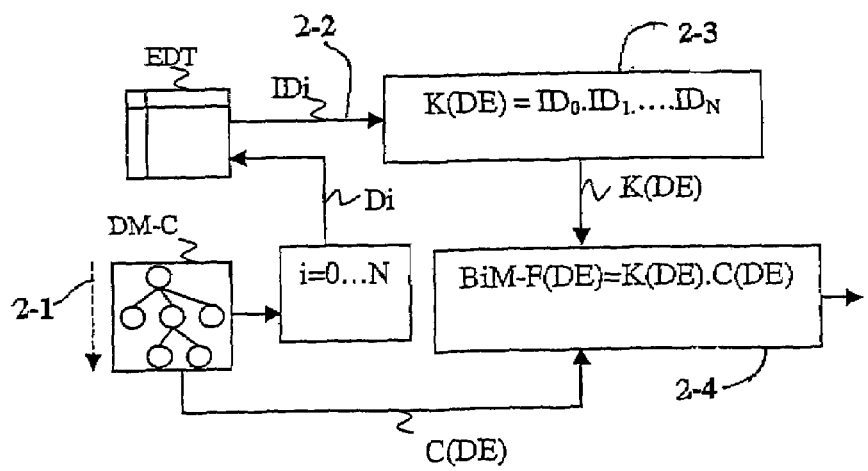
Figure 3:
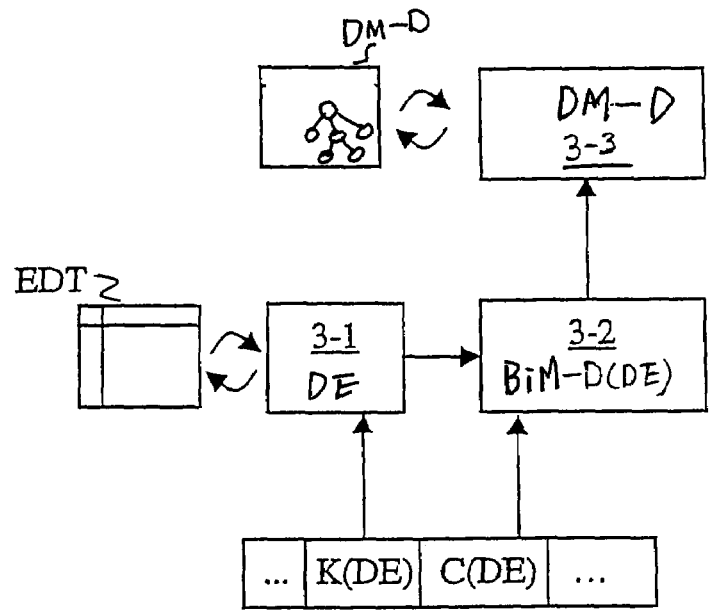
Figure 4:
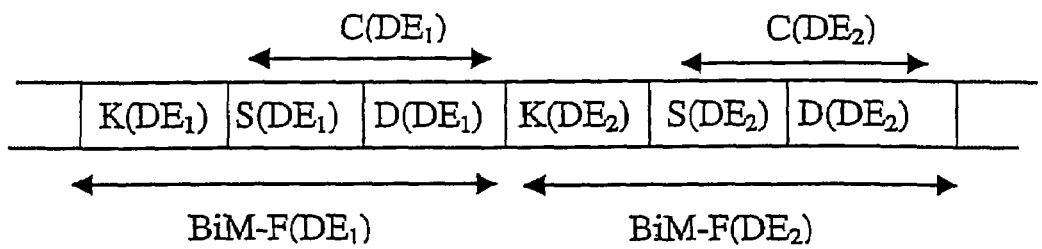
Figure 6:
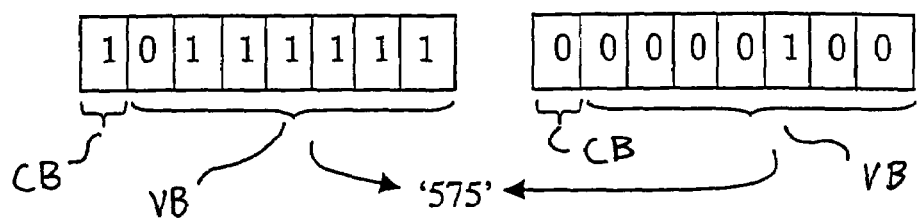
Figure 5:
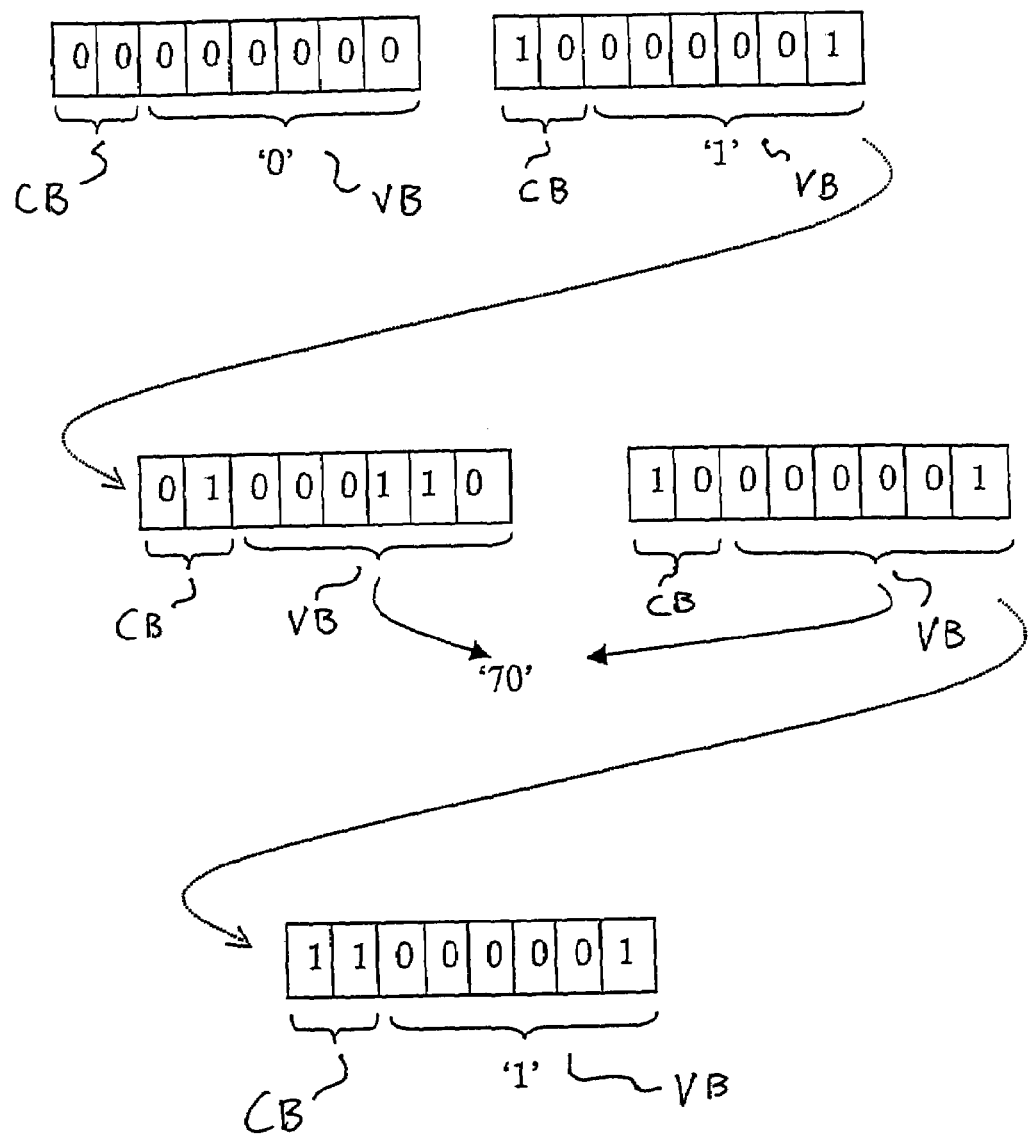

Further features and advantages of the invention will become more readily apparent from the following detailed description, which specifies and shows a preferred embodiment of the invention in which:

FIG. 1 is a schematic representation of a transmission system according to the invention, FIG. 2 is a diagram describing the steps of a coding method according to the invention, FIG. 3 is a diagram describing the steps of a decoding method according to the invention, FIG. 4 is a fragment embodied in a signal according to the invention, FIG. 5 is an example of binary encoding of an instance compact key, FIG. 6 is an example of binary encoding of the value of a description element.

The invention will now be described by reference to XML instances of XML-schemas. This is not restrictive. The invention is applicable to any instances and schemas written in Markup Language of the same type.

An XML-like schema defines a hierarchical structure of description elements (either an element or an attribute in the XML terminology) comprising parent description elements and child description elements. An instance of an XML-like schema is an XML-like document comprising description elements structured as defined in said XML-like schema. Some of the description elements of an instance have a content. Other are only structural containers.

As described in FIG. 1, a transmission system according to the invention comprises an encoder BiM-C located at the transmission side and a decoder BiM-D located at the reception side. Both the encoder BiM-C and the decoder BiM-D have access to an XML-schema XML-S (the XML-schema is either available locally or downloaded).

They also have access to at least one table EDT, called Element Declaration Table, directly and unambiguously generated from the XML-schema. The Element Declaration Table is primarily intended to contain all the information needed to encode and decode any instance that is valid with respect to a given schema definition. The Element Declaration Table is generated once and available for coding and decoding an instance that refers to the associated schema. It doesn't have to be sent to the client.

The encoder scans a hierarchical memory representation DM-C of an instance XML-C (a DOM representation as defined in the W3C specification<<Document Object Model, level 1 specification, version 1.0, Oct. 1, 1998>>, or any other hierarchical memory representation of the instance) and uses the information contained in the Element Declaration Table in order to generate one or more binary fragments BiM-F each binary fragment being associated to a description element of the instance.

According to the invention, the description elements that have a primitive type content (e.g. built-in type, simple type, a descriptor with its own binary representation) are encoded as an independent fragment composed of a sequence of identification information (also called instance structuring key) and a content value. The description elements within the XML hierarchy that are only structural containers (i.e. having no content value) are not transmitted but inferred at the decoder side from the Element Declaration Table.

The binary fragments BiM-F are transmitted over a transmission network NET and received by the decoder BiM-D. The decoder uses the Element Declaration Table in order to retrieve:

all the parent structural description elements,
the description element nature (element or attribute),
the description element name,
the description element type in order to decode the content value.

The decoder BiM-D updates accordingly a hierarchical memory representation DM-D. An XML instance XML-D is then generated from the updated hierarchical memory representation.

One can see the Element Declaration Table as an exhaustive definition of the possible valid instances, generated uniquely and unambiguously from the schema by developing the element and attribute declaration structures. Indeed, the XML-schema gives mainly two kinds of information: On the one hand, the location of all the possible elements and attributes within the XML instance hierarchy is specified by means of complex type definitions (either named or anonymous) and element declarations. On the other hand, the type of their value is given through the use of built-in datatypes and simple type definitions. For each element or attribute that is specified in the schema and that can be found in the instance, the Element Declaration Table gathers its name (e.g. the tag name for an element), its type, its nature (element or attribute) and a key (called table structuring key) specifying unambiguously its location within the hierarchical XML structure. While the schema is defining what an instance should look like for validation and interoperability purpose, the Element Declaration Table is stating what an instance will look like from a structural perspective for coding purpose.

The basics of the Element Declaration Table and its use in the encoding and decoding process stand in the table structuring key, intended to uniquely identify:

the type and name of the description element being transmitted.
its location in the XML instance hierarchy.

The syntax of this structuring key is a dotted notation where the dots denote hierarchy levels and the numbering at each level is performed by expanding all the elements and attributes declarations from the schema. The last digit of the notation is an identification information solely identifying a description element in its hierarchical level. The previous digits are pointing information used for retrieving a child description element from its parent description element.

When a description element is defined in the schema as having or possibly having multiple occurrences, an occurrence information is added at the end of the dotted notation (in the following of the description the occurrence information is represented by brackets).

The process of generating the Element Declaration Table is comparable to browse through all the element declarations in the schema in order to come up with a hierarchical memory representation of the biggest instance (the one instantiating all possible elements and attributes) corresponding to a given schema. Nevertheless, this "biggest" instance is infinite as soon as the schema defines self-embedding structures, commonly used within MPEG-7. Hence, there is a clear need for capturing the self-containment in the Element Declaration Table. This is done by specifying, in case of a self-contained description element, the table structuring key of its ancestor in the tree structure that has the same complex type. Such an element is thus not expanded further in the Element Declaration Table. The table structuring key of the ancestor is called self-containment key. It is also used for retrieving a child description element from its parent description element.

The pointing information together with the self-containment key are the structural information used to retrieve any child description element from its parent description element. When a parent description element is a self-contained description element, its children are the description elements which pointing information are identical to the self-contained key of said parent description element. When a parent is not a self-contained description element, its children description elements are the description elements which pointing information are identical to said parent table structuring key.

The Element Declaration Table allows to state a unique and unambiguous numbering of all possible instances of the schema. We will now give examples of schemas and corresponding Element Declaration Table.

EXAMPLE 1

Schema 1:

```
<complexType name= "complexType1">
    <sequence>
        <element name="Element1" type="type1"/>
<element name="Element2" type="type2" minOccurs="0" maxOccurs="unbounded"/>
<element name="Element3">
    <complexType>
        <sequence>
            <element name="Element4" type="type4" minOccurs="0" maxOccurs="1"/>
            <element name="Element1" type="type1"/>
        </sequence>
    </complexType>
</element>
    </sequence>
    <attribute name="Attribute1" type="type4"/>
</complexType>
<element name="GlobalElement" type="complexType1"/>
```

The Element Declaration Table, seen as a development of all schema element declarations, would contain among other information the following element names together with their corresponding table structuring key:

TABLE 1

| Name | Table structuring key | (...) |
|---|---|---|
| GlobalElement | 0 | |
| Element1 | 0.0 | |
| Element2 | 0.1[] | |
| Element3 | 0.2 | |
| Element4 | 0.2.0 | |
| Element1 | 0.2.1 | |
| Attribute1 | 0.3 | |

The underlined digits are the identification information.

EXAMPLE 2

Schema 2:

```
<complexType name="complexType1">
    <sequence>
        <element name="Element1" type="complexType2"/>
<element name="Element2" type="type2" minOccurs="0" maxOccurs="unbounded"/>
<element name="Element3" type="type3"/>
    </sequence>
    <attribute name="Attribute1" type="type4"/>
</complexType>
<complexType name="complexType2">
    <sequence>
<element name="Element4" type="type4"/>
        <element name="Element1" type="complexType2"/>
    </sequence>
</complexType>
<element name="GlobalElement" type="complexType1"/>
```

The Element Declaration Table contains, among other information such as the name and key of the elements, the self-containment field when relevant:

TABLE 2

| Name | Table structuring key | Self-containment key | (...) |
|---|---|---|---|
| GlobalElement | 0 | | |
| Element1 | 0.0 | | |
| Element4 | 0.0.0 | | |
| Element1 | 0.0.1 | 0.0 | |
| Element2 | 0.1 [ ] | | |
| Element3 | 0.2 | | |
| Attribute1 | 0.3 | | |

The underlined digits of the table structuring key are the identification information. The non-underlined digits of the table structuring key and the self-containment key are the structural information used to retrieve any child description element from its parent description element.

Note that the brackets in the Element2 table structuring key denote the presence of a multiple occurrence element. Moreover, Element2 and Element4 are taken into account in the numbering even though they are optional elements. Note also that the Element1 appears twice in the table since it can be instantiated at different locations within the tree structure.

EXAMPLE 3

Schema:

```
<?xml version="1.0" encoding="UTF-8"?>
<schema xmlns:xsd="http://www.w3.org/1999/XMLSchema">
<complexType name="MediaTimeType" content="elementOnly">
    <sequence>
        <element name="Start">
            <simpleType base="integer"/>
        </element>
        <element name="Stop">
            <simpleType base="integer"/>
        </element>
    </sequence>
    <attribute name="timeunit" type="string" use="required"/>
</complexType>
<complexType name="VideoSegmentType" content="elementOnly">
    <sequence>
        <element name="keyFrame" minOccurs="1" maxOccurs="unbounded">
            <simpleType base="string"/>
        </element>
        <element name="Annotation" type="string" minOccurs="0" maxOccurs="1"/>
        <element name="MediaTime" type="MediaTimeType" minOccurs="0" maxOccurs="1"/>
        <element name="VideoSegment" type="VideoSegmentType" minOccurs="0" maxOccurs="unbounded"/>
    </sequence>
    <attribute name="id" use="required">
        <simpleType base="string"/>
    </attribute>
</complexType>
<element name="VideoSegment" type="VideoSegmentType"/>
</schema>
```

TABLE 3

| Name | Table structuring key | Self-containment key | (...) |
|---|---|---|---|
| VideoSegment | 0 | | |
| KeyFrame | 0.0 [] | | |
| Annotation | 0.1 | | |
| MediaTime | 0.2 | | |

TABLE 3-continued

| Name | Table structuring key | Self-containment key | (...) |
|---|---|---|---|
| Start | 0.2.<u>0</u> | | |
| Stop | 0.2.<u>1</u> | | |
| Timeunit | 0.2.<u>2</u> | | |
| VideoSegment | 0.<u>3</u> [ ] | 0 | |
| Id | 0.<u>4</u> | | |

The underlined digits of the table structuring key are the identification information. The non-underlined digits of the table structuring key and the self-containment key are the structural information used to retrieve any child description element from its parent description element.

A method for encoding a description element of an instance of a schema will now be described by reference to FIG. 2. According to FIG. 2 in order to encode a description element DE of an instance XML-C of a schema XML-S, the hierarchical memory representation DM-C of the instance XML-C is scanned from parent to child description element until reaching the description element DE to be encoded (step 2-1). At each hierarchical level, the identification information $ID_i$ associated to the scanned description element $D_i$ is retrieved from the table EDT that is associated to the schema XML-S (step 2-2). The instance structuring key K(DE) of the description element DE is built as a sequence of the retrieved identification information $ID_i$ (step 2-3). The fragment BiM-F(DE) is finally built by adding the content C(DE) of the description element DE to the sequence of retrieved identification information (step 2-4). The fragment is converted in binary format for transmission.

An example of such an encoding process will now be given in reference to the above described EXAMPLE 3.

ARRAY 1 below gives an example of an instance of the schema described in EXAMPLE 3. On the left are given the instance structuring key of the element defined in the corresponding line of the array. On the right are given the instance structuring key of the attribute defined in the corresponding line of the array. Those instance structuring keys have been obtained by using the above described encoding method.

The encoding of the description element <MediaTime timeunit="PT1N30F"> appearing in bold character in Array 1 will now be described step by step as illustrative purpose.

step 1-1: a hierarchical memory representation of the instance is scanned from parent description element to child description element until reaching the description element to be encoded (here the attribute "timeUnit" of an element "MediaTime"); the scanned description elements are:
VideoSegment
    VideoSegment (first occurring child of a VideoSegment)
        VideoSegment (second occurring child of a VideoSegment)
            MediaTime
                timeUnit step 1-2: the corresponding identification information (including the index if applicable) are retrieved from Table 3:
VideoSegment ... 0
    VideoSegment (first ocuurring child of a videoSegment) ... 3[0]
        VideoSegment (second occurring child of a videoSegment) ... 3[1]
            Media Time ... 2
            Time Unit ... 2

Step 1-3: a sequence of the retrieved identification information is built: 0.3 [0].3[1].2.2. This sequence is the instance structuring key associated to the encoded description element.

The other instance structuring keys given in Array 1 can be derived in the same way.

The instance structuring key can also be seen as an instantiation of the table structuring key. Indeed, the multiple occurrence elements are actually indexed (resulting in instance structuring keys such as 0.3[0], 0.3[1], ... ) and the self-containment loops are developed (resulting in instance structuring keys such as 0.3[0].3[1].2.2 that do not appear in the table but can be computed from it). The instance structuring key is encoded as a description element identifier in an instance binary fragment.

A method for decoding a fragment will now be described by reference to FIG. 3. According to FIG. 3, a decoding method according to the invention consists in:
    step 3-1: finding in the table the description element (DE) associated to the received sequence of identification information,
    step 3-2: decoding (BiM-D) the received content (C(DE)) according to the primitive type of said description element (found in the table),
    step 3-3: updating the hierarchical memory representation (DM-D) by adding said element together with its content; adding its parent description element if they are missing; and in case of multiple occurrences, adding same description elements of lower rank if they are missing.

ARRAY 1

| Element Instance Structuring Key | Instance | Attribute Instance Structuring Key |
|---|---|---|
| | <?xml version="1.0" encoding="UTF-8"?> | |
| 0 | <VideoSegment id="VS1"> | 0.4 |
| 0.0[0] |     <keyFrame>./../video/Scotland.jpg</keyFrame> | |
| 0.1 |     <Annotation>My trip in Scotland</Annotation> | |
| 0.2 |     <MediaTime timeunit="PT1N30F"> | 0.2.2 |
| 0.2.0 |         <Start>0</Start> | |
| 0.2.1 |         <Stop>1500</Stop> | |
| |     </MediaTime> | |
| 0.3[0] |     <VideoSegment id="VS2"> | 0.3[0].4 |
| 0.3[0].0[0] |         <keyFrame>./../video/video_landscape/landscape1.jpg</keyFrame> | |

-continued

ARRAY 1

| Element Instance Structuring Key | Instance | Attribute Instance Structuring Key |
|---|---|---|
| 0.3[0].0[1] | <keyFrame>./../video/video_landscape/landscape2.jpg</keyFrame> | |
| 0.3[0].0[2] | <keyFrame>./../video/video_lanscape/landscape2.jpg</keyFrame> | |
| 0.3[0].3[0] | <VideoSegment id="VS3"> | 0.3[0].3[0].4 |
| 0.3[0].3[0].0[0] | | |
| 0.3[0].3[0].1 | <keyFrame>./../video/video_landscape/forest.jpg</keyFrame> | |
| 0.3[0].3[0].2 | <Annotation>forest of oaks</Annotation> | |
| 0.3[0].3[0].2.0 | <MediaTime timeunit="PT1N30F"> | 0.3[0].3[0].2.2 |
| 0.3[0].3[0].2.1 | <Start>0</Start> | |
| | <Stop>200</Stop> | |
| | </MediaTime> | |
| 0.3[0].3[1] | </VideoSegment> | |
| 0.3[0].3[1].0[0] | <VideoSegment id="VS4"> | 0.3[0].3[1].4 |
| 0.3[0].3[1].1 | | |
| 0.3[0].3[1].2 | <keyFrame>./../video/video_landscape/beach.jpg</keyFrame> | |
| 0.3[0].3[1].2.0 | <Annotation>The north beach</Annotation> | |
| 0.3[0].3[1].2.1 | <MediaTime timeunit="PT1N30F"> | 0.3[0].3[1].2.2 |
| | <Start>200</Start> | |
| | <Stop>450</Stop> | |
| | </MediaTime> | |
| | </VideoSegment> | |
| | </VideoSegment> | |
| | </VideoSegment> | |

In practice the received sequence is scanned, identification information by identification information, and the following algorithm is applied to update the hierarchical memory representation of the instance:

Algorithm (1):

step 4-1:

current token=first identification information of the sequence current node=root of the hierarchical memory representation step 4-2:

previous description element=description element corresponding to current node current description element=child of previous description element having current token as identification information step 4-3: does current node have a child node corresponding to the current description element?

step 4-4: if current node has a child node corresponding to the current description element, go to step 4-8 step 4-5: if current node doesn't have a child node corresponding to the current description element, create such a child node, step 4-6: in case of multiple occurrences create brother node(s) of lower rank, if not already existing, step 4-7: if current token=last identification information of the received sequence, add the content to the node created at step 4-5 and go to step 4-8 step 4-8:

current token=next identification information current node=child node go to step 4-2.

For example, at step 4-2, the current description element can be retrieved by using the following algorithm given in C-like code:

Algorithm (2):

Let instance_key be the sequence of token from the first identification information of the received sequence to the current identification of the received sequence.

Let edt_key be the corresponding table structuring key as found in the table

Let prefix(key) be the largest prefix (n first tokens) of key that actually exists in the table.

Let suffix(key) be the last tokens of key so that key=prefix(key)+suffix(key).

```
Let self_cont(key) be the self-containment key.
while ( prefix(instance_key) != instance_key)
{
    instance_key = self_cont( prefix( instance_key) ) +
    suffix( instance_key );
}
edt_key = instance_key ;
    Applying step by step algorithm (2) to the sequence 0.0.1.1.0 in the
above described EXAMPLE 2 gives:
    instance_key = 0.0.1.1.0
    prefix(instance_key) = 0.0.1
    instance_key = self_cont( prefix(instance_key) ) +
    suffix( instance_key ) = 0.0
+ 1.0 = 0.0.1.0
    prefix(instance_key) = 0.0.1
    instance_key = self_cont( prefix(instance_key) ) +
    suffix( instance_key ) = 0.0
+ 0 = 0.0.0
    Which leads finally to:
    edt_key = 0.0.0
``` which means that the current description element is Element 4.

In case of non-self-contained hierarchies, the mapping between the table structuring key and the instance structuring key is straightforward. Indeed, one has simply to remove the indexes found in the instance structuring key to retrieve the corresponding table structuring key. In the above described EXAMPLE 1, a description element represented by the instance structuring key 0.1 [5] is the fifth Element2 present in a globalElement.

In an advantageous embodiment of the invention the table structuring key and the instance structuring key are compacted as will now be described. Experiments have shown that such a compression of the structuring key leads to a significant gain regarding the size of the key while offering exactly the same functionality.

The resulting keys are referred as compact key (in short CSK). In the simpler case (no self-containment), the CSK is the structuring key Element Declaration Table record number.

First, we need to add a key to the current list of EDT fields by numbering the Element Declaration Table records. Applied on the above described EXAMPLE 2, this leads to:

Table2bis:

| Name key | Compact key | Table structuring key | Self-containment |
|---|---|---|---|
| GlobalElement | 0 | 0 | |
| Element1 | 1 | 0.0 | |
| Element4 | 2 | 0.0.0 | |
| Element1 | 3 | 0.0.1 | 0.0 |
| Element2 | 4 | 0.1 [ ] | |
| Element3 | 5 | 0.2 | |
| Attribute1 | 6 | 0.3 | |

Algorithm (3) is used to compute the CSK in the general case (with self-contained structures) from the instance structuring key:

Algorithm (3):

Let instance_key be the instance structuring key of a given description element.
Let cs_key be the corresponding compact structuring key.
Let prefix(key) be the largest prefix (n first tokens) of key that actually exists in the EDT.
Let suffix(key) be the last tokens of key so that key=prefix(key)+suffix(key).
Let self_cont(key) be the self-containment key.
Let compact_form(key) be the corresponding compact form of key in the EDT.

```
while ( prefix(instance_key) != instance_key )
{
    cs_key = cs_key + compact_form( prefix(instance_key) ) ;
    instance_key = self_cont( prefix( instance_key ) ) + suffix( instance_key );
}
cs_key = cs_key + compact_form( prefix(instance_key) ) ;
```

EXAMPLE

We want to compute the CSK corresponding to the following structuring key: 0.0.1.1.0

Applying step by step the algorithm described above gives:
instance_key=0.0.1.1.0
prefix(instance_key)=0.0.1
cs_key=3
instance_key=self_cont(prefix(instance_key) )+suffix( instance_key) 0.0+1.0=0.0.1.0
prefix(instance_key)=0.0.1
cs_key=3.3
instance_key=self_cont(prefix(instance_key)+suffix(instance_key)=0.0+0=0.0.0
Which leads finally to:
cs_key=3.3.2

In the above example, the element is not a multiple occurrence element for sake of expression simplicity. It is nevertheless to be noted that each token of the instance structuring key (resp. the instance CSK) might be indexed (resp. contain several indexes).

The only purpose of the compact structuring key is to reduce the size of the stream. Therefore the instance compact structuring key is firstly decoded to its expanded form (instance structuring key) by the decoder before the above described decoding phase. Algorithm 4 given below returns the instance structuring key corresponding to a instance compact key:

Algorithm (4):

Let resultNCKey be the expanded form of compact_key (result of the algorithm).
Let compact_key be the instance compact structuring key of a given description element.
Let current_key be a token of the instance compact structuring key compact_key.
Let compact_key[i] be the $i^{th}$ token of compact_key.
Let size(compact_key) be the number of tokens of compact_key.
Let diffCode(key1, key2) be the sub-key obtained by removing the common prefix of key1 and key2
Let NCKey(CKey) be the corresponding expanded form of the compact key CKey.
Let self_cont(key) be the self-containment key of key.
All indexes are first removed from compact_key and are put back at the end in the developed form of compact_key:

```
current_key = compact_key[0]
resultNCKey = NCKey(current_key)
for (i=1; i<size(compact_key); i++)
{
    previous_key = current_key ;
    current_key = compact_key[i] ;
    resultNCKey += "." + diffCode(NCKey(current_key),
    self_cont(previous_key)) ;
}
```

EXAMPLE

We want to generate the instance structuring key corresponding to the following CSK 3.3.2

Applying step by step the algorithm described above gives:
compact_key=3.3.2
current_key=3
resultNCKey=0.0.1 (looking at the EDT)
(i=1)
previous_key=3
current_key=3
self_cont(previous_key)=0.0
NCKey(current_key)=0.0.1
diffCode(0.0.1, 0.0)="1"
resultNCKey=resultNCKey+"."+"1"
→resultNCKey=0.0.1.1
(i=2)
previous_key=3
current_key=2 self_cont(previous_key)=0.0
NCKey(current_key)=0.0.0
diffCode(0.0.0, 0.0)="0"
resultNCKey=resultNCKey+"."+"0"
→resultNCKey=0.0.1.1.0
end 3.3.2 is thus the compact form of the instance structuring key 0.0.1.1.0

An example of binary syntax will now be described. Fragments are part of a file having a header. The header of the file contains at least an identifier of the schema (either an MPEG-defined ID or a URL as proposed in M6142).

Each fragment is composed of an instance compact structuring key $K(DE_i)$ (or an instance structuring key) and a description element value $C(DE_i)$ (also called content) as described on FIG. 4. The generic form of the instance structuring key is as follows:

Key[ind][ind]( . . . )[ind].Key[ind][ind]( . . . )[ind].( . . . ), where each group Key[ind][ind]( . . . )ind] is called token. Tokens of an instance structuring key comprise at most one index. Tokens of instance compact structuring keys may comprise several indexes. All keys and indexes are integer values coded using a variable number of bytes. The whole structuring key is thus coded using a variable set of bytes, each of them being controlled by the 2 most significant bits with the following semantics:

| Control bits | | |
|---|---|---|
| Bit7 | Bit6 | Semantics |
| 0 | 0 | "New level": The next byte represents the beginning of a new token. |
| 0 | 1 | "Continues": The next byte is to be interpreted as the following bits of the current key or index |
| 1 | 0 | "Indexed": The next byte is the beginning of the next index within the current token. |
| 1 | 1 | "End": The current byte is the last byte of the structuring key. |

FIG. 4 also describes the generic format for encoding description element values. According to FIG. 4, before adding a data value $D(DE_i)$ to the binary file or stream, the size in bytes $S(DE_i)$ of the data block is coded. This aims at informing the decoder about the size of data to be decoded and guaranties an easy random access to data and fast stream parsing. Since certain primitive data types can imply a large amount of bytes (e.g. free text annotation or movie scripts), we propose to code the data size using a variable number of bytes.

The length is thus coded by default using one byte, with the most significant bit being interpreted as follows:

| Bit7 | Semantics |
|---|---|
| 0 | "end": The length coding is finished |
| 1 | "continues": The length coding continues on the next byte |

FIG. 5 gives an example of a binary encoding for the compact key <<0.1[70][1]>>. Five bytes are needed to encode the compact key <<0.1[70][1]>>. Each byte starts with two control bits (CB). The six less significant bits are used to encode the value. The control bits of the first byte are '00'(new level). Its value bits (VB) are '000000' which is the binary representation of the first identification information of the sequence ('0'). The control bits (CB) of the second byte are '10' ('indexed'). Its value bits (VB) are '00001' which is the binary representation of the second identification information of the sequence ('1'). The binary representation of the first index '70' is '1000110' which contains more than six bits. Therefore the encoding is done on two bytes: the third and the fourth bytes. The control bits (CB) of the third byte are '01' (continue). Its value bits (VB) are '000110' (less significant bits of the index to be encoded). The control bits (CB) of the fourth byte are '10' (indexed). Its value bits (VB) are '000001' (most significant bits of the index to be encoded). Finally the control bits (CB) of the fifth byte are '11' (end). And its value bits (VR) are '000001' (binary value of the index to be encoded).

FIG. 6 gives an example of a binary encoding of the data size 575 (binary: 10 00111111). The first byte is composed of the 7 less significant bits of the length value (VB) with the addition of a control bit (CB) specifying that another byte is required. The second byte contains the remaining bits (VB) with the "end" control bit (CB).

As already mentioned, a major advantage of the proposed coding scheme is to encode only the attributes and elements that contain a primitive type value, and skip the elements that are only structural containers (e.g. with a complex type). This is allowed given that the structure can be inferred at the decoder side using the Element Declaration Table.

EXAMPLE

Consider the following instance fragment (found in the core experiment test set):

```
<GenericDS>
    <MediaInformation>
        <MediaProfile>
            <MediaInstance>
                <InstanceLocator>
                    <MediaURL>imgs/img00587_add3.jpg</MediaURL>
                </InstanceLocator>
            </MediaInstance>
        </MediaProfile>
    </MediaInformation>
</GenericDS>
```

In this case, only the MediaURL would be encoded (as a string) using a structuring key that allows the decoder to reconstruct the whole structure from the Element Declaration Table. The other container elements would not be transmitted.

In the general case, all the elements which type is primitive (i.e. for which a binary representation is available in a standard way which ensures interoperability) shall be encoded.

Examples of such primitive types are the XML-schema built-in types (e.g. string, float, . . . ) as well as the MPEG-7 specific basic types (e.g. unsignedInt1, unsignedInt2, MediaTime, Matrix, . . . ).

Primitive types also include extended types that might include complex types in the following cases:
  there is no need for accessing randomly the embedded elements within the complex type structure.
  an efficient binary representation already exists.

These criteria are certainly fulfilled in the case of descriptors as defined by the video and audio group of MPEG-7.

Indeed, a compact binary representation has already been defined and should be used. Furthermore, there is (most of the time) no need for accessing the individual parts of the descriptors (they make sense as a whole).

The efficiency (in terms of content compression) will increase with an increasing number of primitive types (which are encoded in an optimal way), but so does the complexity of the decoder which is supposed to include the decoding methods for all the standard primitive types.

ARRAY 2 below is an example of compact instance structuring key for the instance already used in ARRAY 1. The compact instance structuring key associated to the description element <MediaTime timeUnit='PT1N30F'> is 7[0].7[1].6. The binary representation of this compact instance structuring key is '10-000111 00-000000 10-000111 00-000001 11-000110'. The length of the content is encoded on 1 byte:0-0000111. And the value PT1N30F is converted from string characters to bytes using usual character coding.

and structural information for retrieving any child description element from its parent description element, scanning a hierarchical memory representation of said instance from parent description elements to child description elements until reaching the description element to be encoded, and retrieving the identification information of each scanned description element from said table, encoding said description element to be encoded as a binary fragment comprising said content, including a data block size, and a sequence of the retrieved identification information, wherein each byte within said sequence of the retrieved identification information includes at least two control bits; and transmitting said encoded description element.

2. An encoding method as claimed in claim 1, characterized in that when a description element is defined in the schema as possibly having multiple occurrences, said table

ARRAY 2

| Element Compact Key | Instance | Attribute Compact Key |
|---|---|---|
|  | <?xml version="1.0" encoding="UTF-8"?> |  |
| 0 | <VideoSegment id="VS1"> | 8 |
| 1[0] | <keyFrame>./../video/Scotland.jpg</keyFrame> |  |
| 2 | <Annotation>My trip in Scotland</Annotation> |  |
| 3 | <MediaTime timeunit="PT1N30F"> | 6 |
| 3 | <Start>0</Start> |  |
| 5 | <Stop>1500</Stop> |  |
|  | </MediaTime> |  |
| 7[0] | <VideoSegment id="VS2"> | 7[0].8 |
| 7[0].1[0] | <keyFrame>./../video/video_landscape/landscape1.jpg</keyFrame> |  |
| 7[0].1[1] | <keyFrame>./../video/video_landscape/landscape2.jpg</keyFrame> |  |
| 7[0].1[2] | <keyFrame>./../video/video_lanscape/landscape2.jpg</keyFrame> |  |
| 7[0].7[0] | <VideoSegment id="VS3"> | 7[0].7[0].8 |
| 7[0].7[0].1[0] | <keyFrame>./../video/video_landscape/forest.jpg</keyFrame> |  |
| 7[0].7[0].2 | <Annotation>forest of oaks</Annotation> |  |
| 7[0].7[0].3 | <MediaTime timeunit="PT1N30F"> | 7[0].7[0].6 |
| 7[0].7[0].4 | <Start>0</Start> |  |
| 7[0].7[0].5 | <Stop>200<Stop> |  |
|  | </MediaTime> |  |
|  | <VideoSegment> |  |
| 7[0].7[1] | <VideoSegment id="VS4"> | 7[0].7[1].8 |
| 7[0].7[1].1[0] | <keyFrame>./../video/video_landscape/beach.jpg</keyFrame> |  |
| 7[0].7[1].2 | <Annotation>The north beach</Annotation> |  |
| 7[0].7[1].3 | <MediaTime timeunit="PT1N30F"> | 7[0].7[1].6 |
| 7[0].7[1].4 | <Start>200</Start> |  |
| 7[0].7[1].5 | <Stop>450</Stop> |  |
|  | </MediaTime> |  |
|  | </VideoSegment> |  |
|  | </VideoSegment> |  |
|  | <VideoSegment> |  |

The invention claimed is:

1. An encoding method for encoding a description element of an instance of a markup language schema defining a hierarchical structure of description elements, said hierarchical structure comprising hierarchical levels, parent description elements and child description elements, said description elements to be encoded comprising a content, wherein the method includes the steps of:

providing a table derived from said schema, said table containing identification information for solely identifying each description element in a hierarchical level, further comprises, for said description element, an occurrence information for indicating that said description element may have multiple occurrences in an instance, and when an occurrence having a given rank is scanned during the encoding, the corresponding retrieved identification information is indexed with said rank.

3. A decoding method for decoding a binary fragment comprising a content and a sequence of identification information, the decoding method comprising the steps of:

using at least one table derived from a markup language schema, said schema defining a hierarchical structure of description elements comprising hierarchical levels, parent description elements and child description elements, said table containing identification information for solely identifying each description element in a hierarchical level, and structural information for retrieving any child description elements from it parent description element, scanning said sequence identification information by identification information, at each step searching in said table for the description element associated to the current identification information and adding said description element to a hierarchical memory representation of an instance of said schema if not already contained in said hierarchical memory representation, and decoding said binary fragment by adding a data element from said content to the description element of said hierarchical memory representation that is associated to the last identification information of said sequence.

4. A decoding method as claimed in claim 3, characterized in that when a description element is defined in the schema as possibly having multiple occurrences, said table further comprises for said description element an occurrence information for indicating that said description element may have multiple occurrences in an instance, and when said sequence comprises an indexed identification information, said index is interpreted as an occurrence rank for the associated description element, same description element(s) of lower rank(s) being added to said hierarchical memory representation if not already contained in said hierarchical memory representation.

5. An encoder for encoding a description element of an instance of a markup language schema defining a hierarchical structure of description elements, said hierarchical structure comprising hierarchical levels, parent description elements and child description elements, said description elements to be encoded comprising a content, the encoder comprises:

a memory for storing at least one table derived from said schema, said table containing identification information for solely identifying each description element in a hierarchical level, and structural information for retrieving any child description element from its parent description clement, and computing means for scanning said instance from parent description elements to child description elements until reaching the description element to be encoded, and retrieving the identification information of each scanned description element, and for encoding said description element to be encoded as a binary fragment comprising said content, including a data block size, and a sequence of the retrieved identification information, wherein each byte within said sequence of the retrieved identification information includes at least two control bits; and means for outputting the encoded description element.

6. A decoder for decoding a binary fragment comprising a content and a sequence of identification information, characterized in that the decoder comprises:

a memory for storing at least one table derived from a markup language schema, said schema defining a hierarchical structure of description elements comprising hierarchical levels, parent description elements and child description elements, said table containing identification information for solely identifying each description element in a hierarchical level, and structural information for retrieving any child description element from its parent description element, computing means for:

scanning said sequence identification information by identification information, at each step searching in said table for the description element associated to the current identification information and adding said description element to a hierarchical memory representation of an instance of said schema if not already contained in said hierarchical memory representation, adding a data element from said content to the description element of said hierarchical memory representation that is associated to the last identification information of said sequence to decode said binary fragment; and outputting said decoded description element.

7. A transmission system comprising an encoder as claimed in claim 5.

8. A transmission system comprising a decoder as claimed in claim 6.

9. A data transmission system, the data transmfision system transmitting a signal over a transmission network comprising an encoder and a decoder, each having a memory storing at least one table derived from a markup language schema, said markup language schema defining a hierarchical structure of description elements, said hierarchical structure comprising hierarchical levels, parent description elements and child description elements, said table containing identification information for solely identifying each description element in a hierarchical level, and structural information for retrieving any child description element from its parent description element:

said signal includes at least one binary fragment representing a content of an encoded description element, and a sequence of identification information being associated in said table to said encoded description element and at least one parent description element, wherein each byte within said sequence of the retrieved identification information includes at least two control bits, and the sequence of identification information is usable by the decoder as a key to decode the encoded description element.

* * * * *